(12) United States Patent
Ishikawa

(10) Patent No.: US 8,060,333 B2
(45) Date of Patent: Nov. 15, 2011

(54) TEST APPARATUS AND TEST METHOD

(75) Inventor: Shinichi Ishikawa, Saitama (JP)

(73) Assignee: Advantest Corporation, Tokyo (JP)

( * ) Notice: Subject to any disclaimer, the term of this patent is extended or adjusted under 35 U.S.C. 154(b) by 163 days.

(21) Appl. No.: 12/557,443

(22) Filed: Sep. 10, 2009

(65) Prior Publication Data

US 2011/0060545 A1 Mar. 10, 2011

(51) Int. Cl.
*G06F 19/00* (2006.01)
*G01R 31/28* (2006.01)

(52) U.S. Cl. ......... 702/120; 702/119; 714/739; 714/742
(58) Field of Classification Search ............... 702/108, 702/119, 120, 121, 123; 714/736, 738, 739 714/742, 743; 324/750.01
See application file for complete search history.

(56) References Cited

U.S. PATENT DOCUMENTS

| 6,587,983 | B1 | 7/2003 | Nakayama |
| 7,284,177 | B2 * | 10/2007 | Hollander et al. ............ 714/739 |
| 2006/0190794 | A1 | 8/2006 | Murata |

FOREIGN PATENT DOCUMENTS

| JP | 2000-98007 A | 4/2000 |
| JP | 2000-292495 A | 10/2000 |
| JP | 2006-058251 A | 3/2006 |

OTHER PUBLICATIONS

Evans, "The New ATE: Protocol Aware", Test Conference, 2007. ITC 2007. IEEE International, Oct. 21-26, 2007, pp. 1-10, Santa Clara, CA.
The explanation of circumstances concerning the accelerated examination dated Sep. 1, 2010, in a counterpart Japanese patent application JP2010-195529 submitted to Japanese Patent Office.
The explanation of circumstances concerning the accelerated examination dated Sep. 1, 2010, for a counterpart Japanese patent application JP2010-195529 submitted to Japanese Patent Office.

* cited by examiner

*Primary Examiner* — John H Le
(74) *Attorney, Agent, or Firm* — Chen Yoshimura LLP

(57) ABSTRACT

Provided is a test apparatus that tests a device under test, including a pattern list storage section that stores a plurality of pattern lists that each designate, in a prescribed order, the test patterns to be output by the device under test, and a pattern list processing section that (i) sequentially outputs the test patterns by sequentially executing the pattern lists according to test results of the device under test and, (ii) when transitioning from a current pattern list to a subsequent pattern list, repeatedly outputs a prescribed idle pattern until execution of the subsequent pattern list is begun.

10 Claims, 9 Drawing Sheets

TEST APPARATUS AND TEST METHOD

BACKGROUND

1. Technical Field

The present invention relates to a test apparatus and a test method.

2. Related Art

As an apparatus for testing a device under test such as a semiconductor chip, a test apparatus is known that executes a pre-supplied pattern list to sequentially output test patterns, as in, for example, Japanese Patent Application Publication No. 2006-058251. The test apparatus selects a subsequent pattern list to execute according to results of the test.

However, when switching between pattern lists, the test apparatus enters a stopped state and does not output a test pattern. Therefore, the device under test must be set to a prescribed state each time the pattern list switches, since the state of the device under test cannot be maintained. For example, each time the pattern list is switched, a process must be performed to initialize the settings and adjust the timing of the device under test.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a pattern list storage section that stores a plurality of pattern lists that each designate, in a prescribed order, the test patterns to be output by the device under test; and a pattern list processing section that (i) sequentially outputs the test patterns by sequentially executing the pattern lists according to test results of the device under test and, (ii) when transitioning from a current pattern list to a subsequent pattern list, repeatedly outputs a prescribed idle pattern until execution of the subsequent pattern list is begun.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
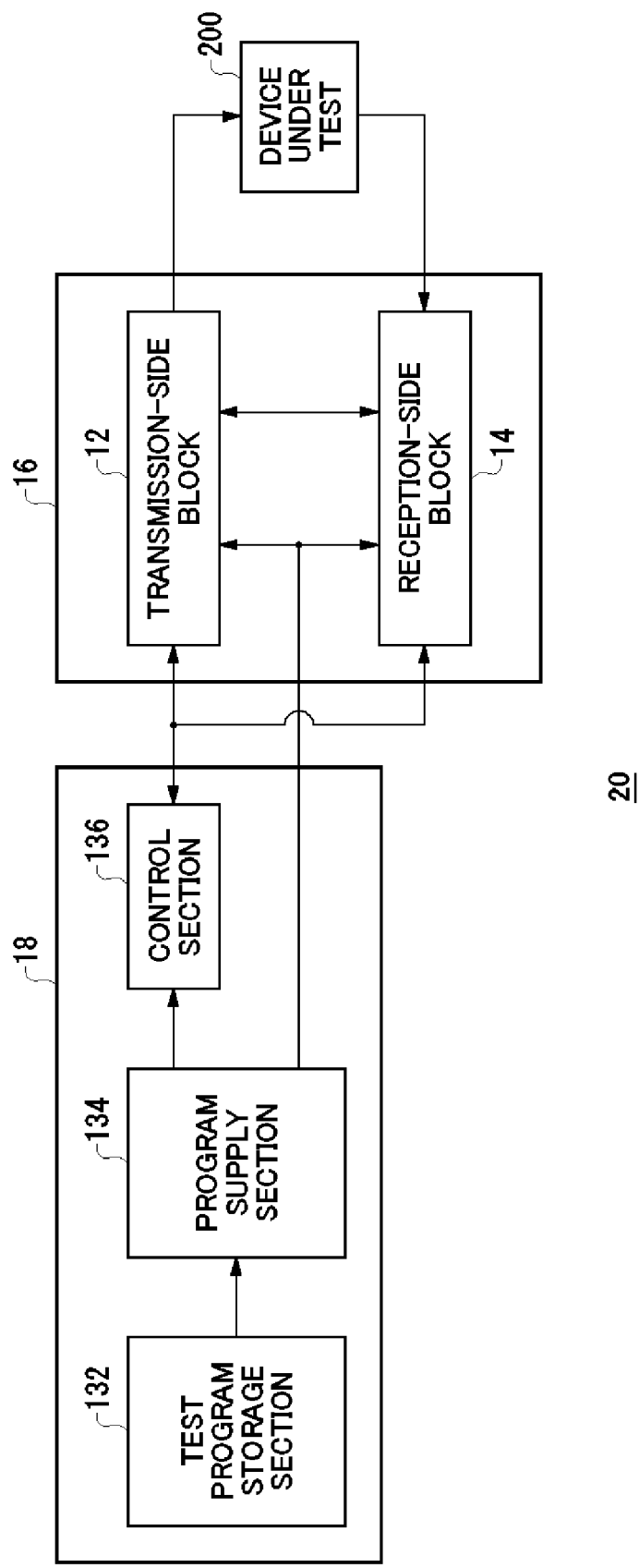
FIG. 1 shows an exemplary configuration of a test apparatus 20 according to an embodiment of the present invention.

FIG. 1 shows an exemplary configuration of a test apparatus 20 according to an embodiment of the present invention. The test apparatus 20 tests a device under test such as a semiconductor chip, and is provided with a communication processing section 16 and an execution processing section 18. The test apparatus 20 may exchange data with the device under test 200 in packet units to which prescribed test functions are allocated in advance. Instead, the test apparatus 20 may exchange the data with the device under test 200 in other types or units.

When exchanging information with the device under test 200 in packet units, the test apparatus 20 may output data in a format corresponding to the communication control of the device under test 200.

The execution processing section 18 includes a test program storage section 132, a program supply section 134, and a control section 136. The communication processing section 16 includes a transmission-side block 12 and a reception-side block 14.

The test program storage section 132 stores a test program supplied thereto. The program supply section 134 generates a plurality of pattern lists that each include a series of test patterns for communication by the communication processing section 16, based on the test program stored in the test program storage section 132, and stores the pattern lists in pattern list storage sections provided in the transmission-side block 12 and the reception-side block 14.

The pattern lists may be packet lists that designate the test patterns in packet units. For example, a packet list may indicate an order in which to execute identification information of a plurality of packets to be generated in order to execute the prescribed test function.

The packet list may be a list indicating an order of set-up packets, transmission packets, ACK packets, or the like. The program supply section 134 generates a packet list corresponding to each test function to be executed by the test program, and stores the packet lists in a packet list storage section 60, described further below.

The transmission-side block 12 sequentially supplies the device under test 200 with test signals corresponding to the test patterns designated by the pattern list. The device under test 200 operates according to each test signal received from the test apparatus 20, and transmits operation results to the reception-side block 14.

The reception-side block 14 judges acceptability of the operation of the device under test 200 based on a response signal received by the device under test 200. For example, the reception-side block 14 may generate an expected value pattern corresponding to pattern data included in a test signal transmitted by the transmission-side block 12, and compare data included in the response signal to the generated expected value pattern. The reception-side block 14 may have the same configuration as the transmission-side block 12, and may receive the same pattern list from the program supply section 134.

Figure 2:
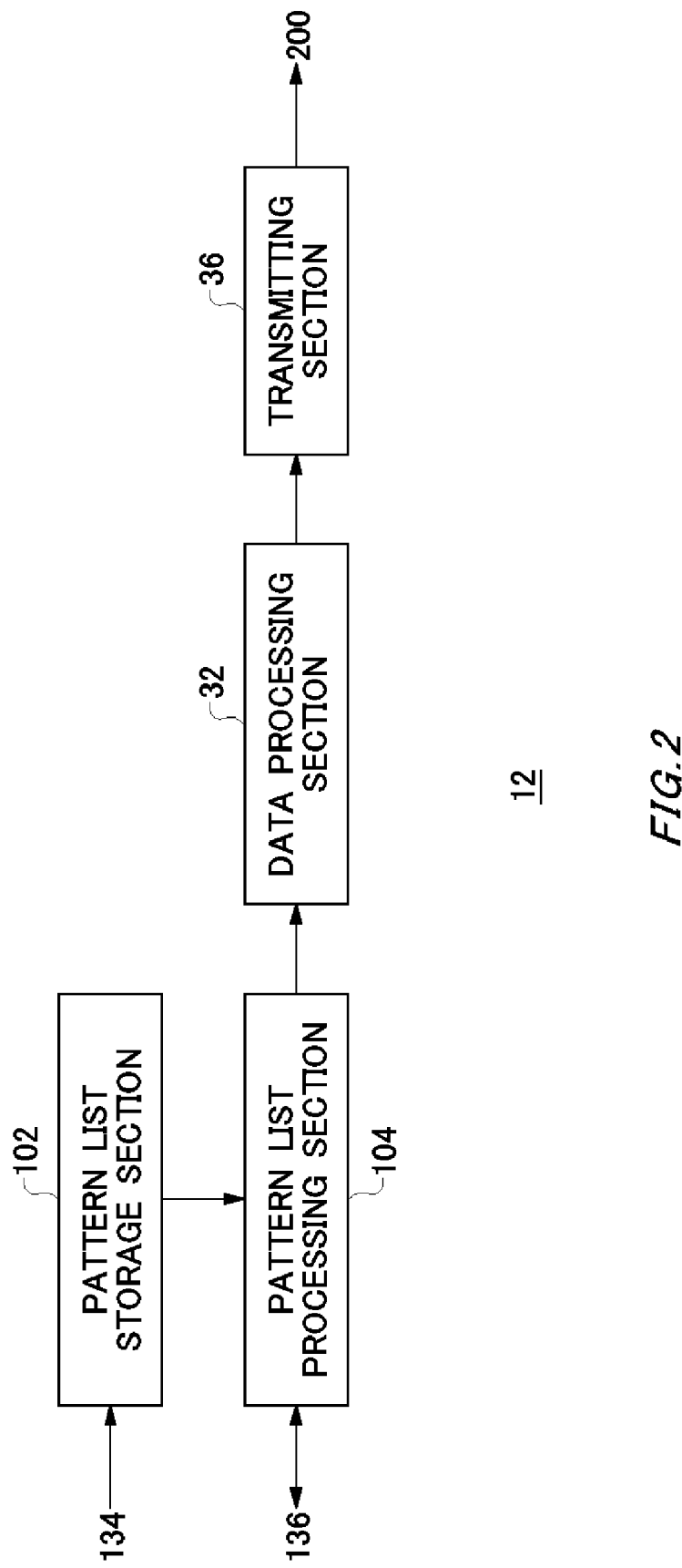
FIG. 2 shows an exemplary configuration of the transmission-side block 12.

FIG. 2 shows an exemplary configuration of the transmission-side block 12. This transmission-side block 12 includes a pattern list storage section 102, a pattern list processing section 104, a data processing section 32, and a transmitting section 36.

The pattern list storage section 102 stores a plurality of pattern lists that designate, in a prescribed order, the test patterns to be output to the device under test 200. The pattern list storage section 102 may store pattern lists supplied from the program supply section 134.

The pattern list processing section 104 executes the pattern lists stored in the pattern list storage section 102 in the prescribed order to sequentially output the test patterns. The pattern list processing section 104 of the present embodiment sequentially performs the pattern lists according to the test results of the device under test 200. In other words, the pattern list to be performed next branches according to the result of the test in the pattern list being currently executed by the pattern list processing section 104.

When transitioning from execution of a certain pattern list to execution of the next pattern list, the pattern list processing section 104 repeatedly outputs a prescribed idle pattern until execution of the next pattern list is begun. For example, the pattern list processing section 104 may repeatedly output a prescribed number of test patterns output immediately prior, as the idle pattern. In this way, when transitioning between pattern lists, the device under test 200 can maintain the immediately prior state.

The data processing section 32 generates a test data sequence corresponding to the test patterns output by the pattern list processing section 104. For example, the data processing section 32 may convert the test patterns output by the pattern list processing section 104 into a data sequence having a preset data arrangement corresponding to the communication protocol of the device under test 200.

The transmitting section 36 transmits, to the device under test 200, a signal corresponding to the data sequence output by the data processing section 32. With this configuration, when transitioning between pattern lists, the device under test 200 maintains a state depending on the test performed until that point.

Figure 3:
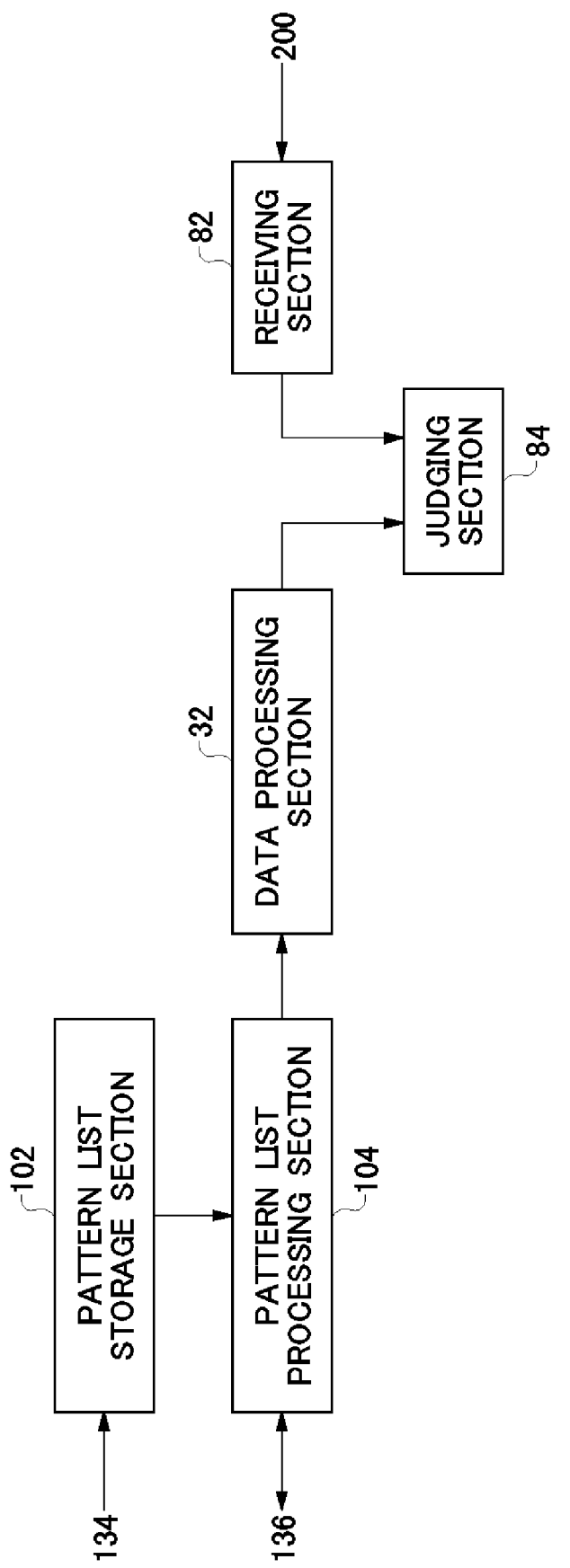
FIG. 3 shows an exemplary configuration of the reception-side block 14.

FIG. 3 shows an exemplary configuration of the reception-side block 14. The reception-side block 14 includes a pattern list storage section 102, a pattern list processing section 104, a data processing section 32, a receiving section 82, and a judging section 84. The pattern list storage section 102, the pattern list processing section 104, and the data processing section 32 may perform the same process as the pattern list storage section 102, the pattern list processing section 104, and the data processing section 32 of the transmission-side block 12. In other words, the data processing section 32 may output, as the expected value data, the same data that is output by the data processing section 32 of the transmission-side block 12.

The receiving section 82 receives the response signal from the device under test 200 and supplies the response signal to the judging section 84. The judging section 84 judges the acceptability of the device under test 200 based on the expected value data received from the data processing section 32 and the data received from the receiving section 82. For example, the judging section 84 may judge the device under test 200 to be acceptable when these two pieces of data match.

Figure 4:
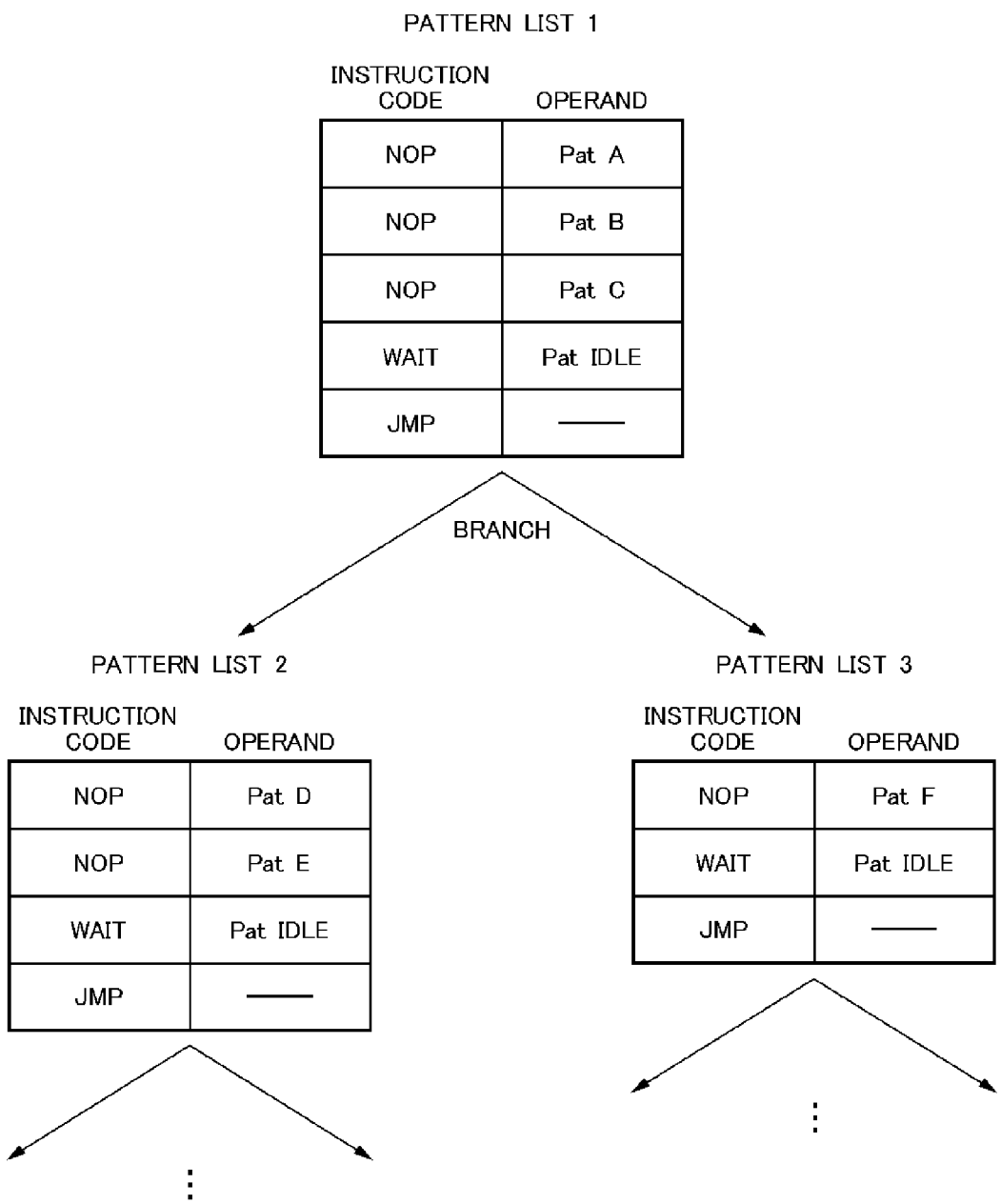
FIG. 4 describes an exemplary operation of the pattern list processing section 104.

FIG. 4 describes an exemplary operation of the pattern list processing section 104. After executing pattern list 1, the pattern list processing section 104 of the present example executes pattern list 2 or pattern list 3, depending on the test result from pattern list 1.

The pattern list storage section 102 of the present example stores pattern lists in which an instruction code including a wait instruction and a jump instruction is associated with operands that designate test patterns, and these pattern lists designate sequential output of the test patterns by executing the instruction codes. For example, each pattern list includes a plurality of pairs of an instruction code and an operand associated with each other. Each instruction code sequentially designates operands to be executed. For example, the instruction codes may include NOP instructions, wait instructions, jump instructions, or the like.

An NOP instruction is an instruction for outputting the test pattern designated by the corresponding operand, and then transitioning to the next instruction code. A wait instruction is an instruction for repeatedly outputting a prescribed idle pattern designated by an operand or the like until a prescribed condition is fulfilled. When the test result of the device under test 200 for a certain test pattern fulfills the prescribed condition, the pattern list processing section 104 may end execution of the wait instruction and execute the following jump instruction.

The jump instruction designates the next pattern list to be executed after the repetition of the wait instruction ends. It should be noted that the pattern list storage section 102 need not store an operand corresponding to the wait instruction. The operand corresponding to the wait instruction may be provided by the control section 136 after execution of pattern list 1 begins.

The control section 136 designates a jump destination indicated by the jump instruction in each pattern list after execution of the pattern list begins. For example, the control section 136 may designate, as the jump destination of the jump instruction, a pattern list that corresponds to the test result of the device under test 200 for the current pattern list.

In this case, while the pattern list processing section 104 is repeatedly executing the wait instruction, the control section 136 may set the jump destination of the corresponding jump instruction in the pattern list processing section 104. The pattern list processing section 104 may end the wait instruction on a condition that the jump destination of the corresponding jump instruction has been set by the control section 136.

The jump destination of the jump instruction may be set as a pattern list number or as an address in the pattern list storage section 102. The test apparatus 20 may further designate, as the jump destination of the jump instruction, a register to be referenced by the pattern list processing section 104. The control section 136 may designate the jump destination by writing, in the register, a number of a pattern list, an address of the pattern list storage section 102, or the like.

As described above, the idle pattern repeated by the wait instruction may be a prescribed number of test patterns output immediately there before. For example, for the wait instruction of pattern list 1, the pattern list processing section 104 may repeatedly output the test pattern Pat C, with the prescribed number of repetitions being 1. The prescribed number of test patterns repeated by the idle pattern may be changed according to a value designated by a user or the like.

With this control, the device under test 200 maintains, the state caused by the test performed up to that point, and the pattern list flow can be branched. The idle pattern repeated by the wait instruction may be set in advance by the user.

The pattern list storage section 102 of the present example stores pattern lists that end with a wait instruction followed by a jump instruction. The program supply section 134 may instead receive, from the test program storage section 132, pattern lists that do not have the wait instruction and jump instruction ending, and a branching condition that designates the next pattern to be executed according to the test result.

The program supply section 134 may add the wait instruction and the jump instruction to the end of each received pattern list, and store the resulting pattern lists in the pattern list storage section 102. The program supply section 134 may notify the control section 136 concerning the branch condition. The control section 136 may designate the jump destination of each jump instruction based on the branch condition and the test result.

Figure 5:
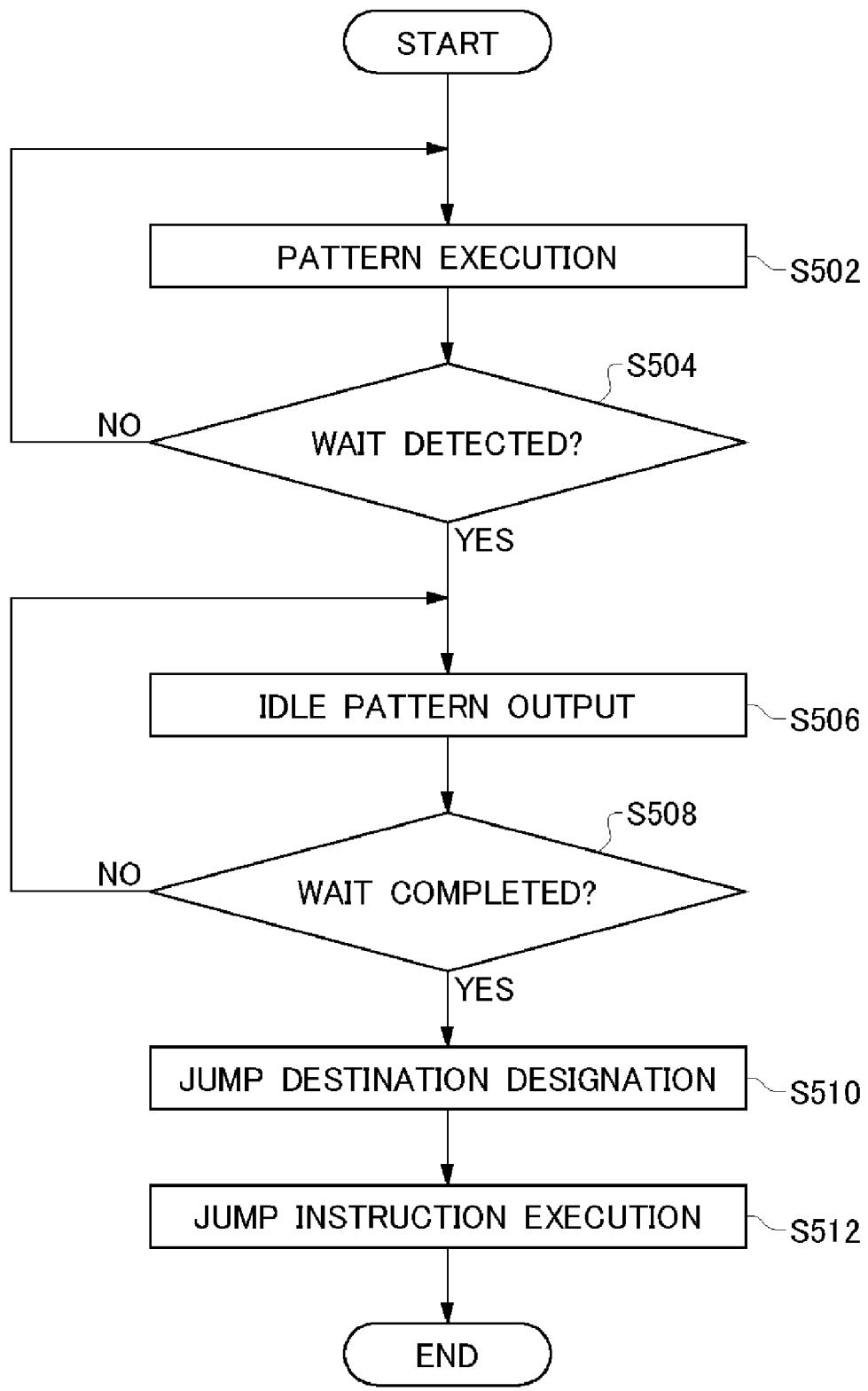
FIG. 5 is a flow chart showing an exemplary operation of the pattern list processing section 104 and the control section 136.

FIG. 5 is a flow chart showing an exemplary operation of the pattern list processing section 104 and the control section 136. The present example describes the operation by which the pattern list processing section 104 outputs the test patterns.

First, the pattern list processing section 104 reads and executes the initial pattern list from the pattern list storage section 102 (S502). The pattern list processing section 104 sequentially outputs the test patterns corresponding to the NOP instruction until the wait instruction is detected (S504).

When the wait instruction is detected, the pattern list processing section 104 outputs the predetermined idle pattern (S506). The pattern list processing section 104 judges whether to end the wait instruction, based on whether the test result of the device under test 200 fulfills the prescribed condition (S508). If the test condition does not fulfill the prescribed condition, the idle pattern is repeatedly output.

When the wait instruction is ended, the control section 136 designates the jump destination of the corresponding jump instruction (S510). The pattern list processing section 104 then ends the wait instruction, and executes the jump instruction (S512). With this control, the state of the device under test 200 can be maintained by repeatedly outputting the idle pattern until the pattern list that is the branch destination is determined.

Figure 6:
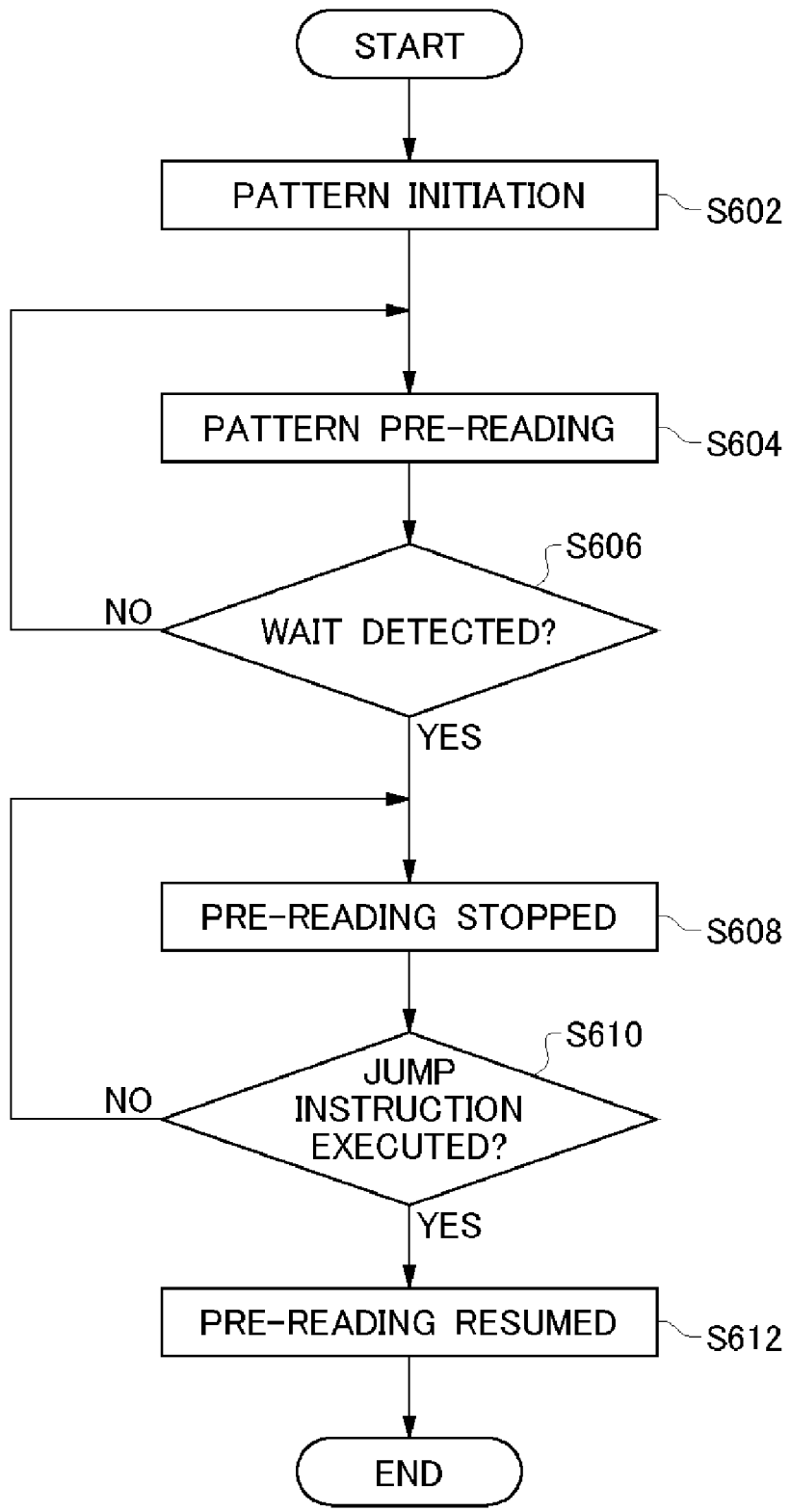
FIG. 6 is a flow chart showing an exemplary operation of the pattern list processing section 104 and the control section 136.

FIG. 6 is a flow chart showing an exemplary operation of the pattern list processing section 104 and the control section 136. This example describes a look-ahead process by the pattern list processing section 104.

The pattern list processing section 104 of the present example performs a look-ahead process that involves reading (i) the instruction code prior to the instruction code to be executed and (ii) the test patterns corresponding to the prior instruction code. The look-ahead process may refer to a process of reading, in advance, the instruction code to be performed after the instruction code being currently performed, and preparing, in advance, a test pattern to be output after the current test pattern is output.

The pattern list processing section 104 begins execution of the pattern list under control of the control section 136 or the like (S602). Here, the pattern list processing section 104 performs the look-ahead process described above (S604).

The pattern list processing section 104 continues the look-ahead process until the wait instruction is detected in the instruction code that is pre-read by the look-ahead process (S606). When the wait instruction is detected, the pattern list processing section 104 stops the look-ahead process (S608). Then, when the jump instruction has been executed (S610), the pattern list processing section 104 resumes the look-ahead process (S612). With this process, the instruction code is pre-read until the next code to be executed has a jump instruction with an undetermined destination. Furthermore, the look-ahead process is resumed immediately after a code to be executed that has a jump instruction with a determined destination.

Figure 7:
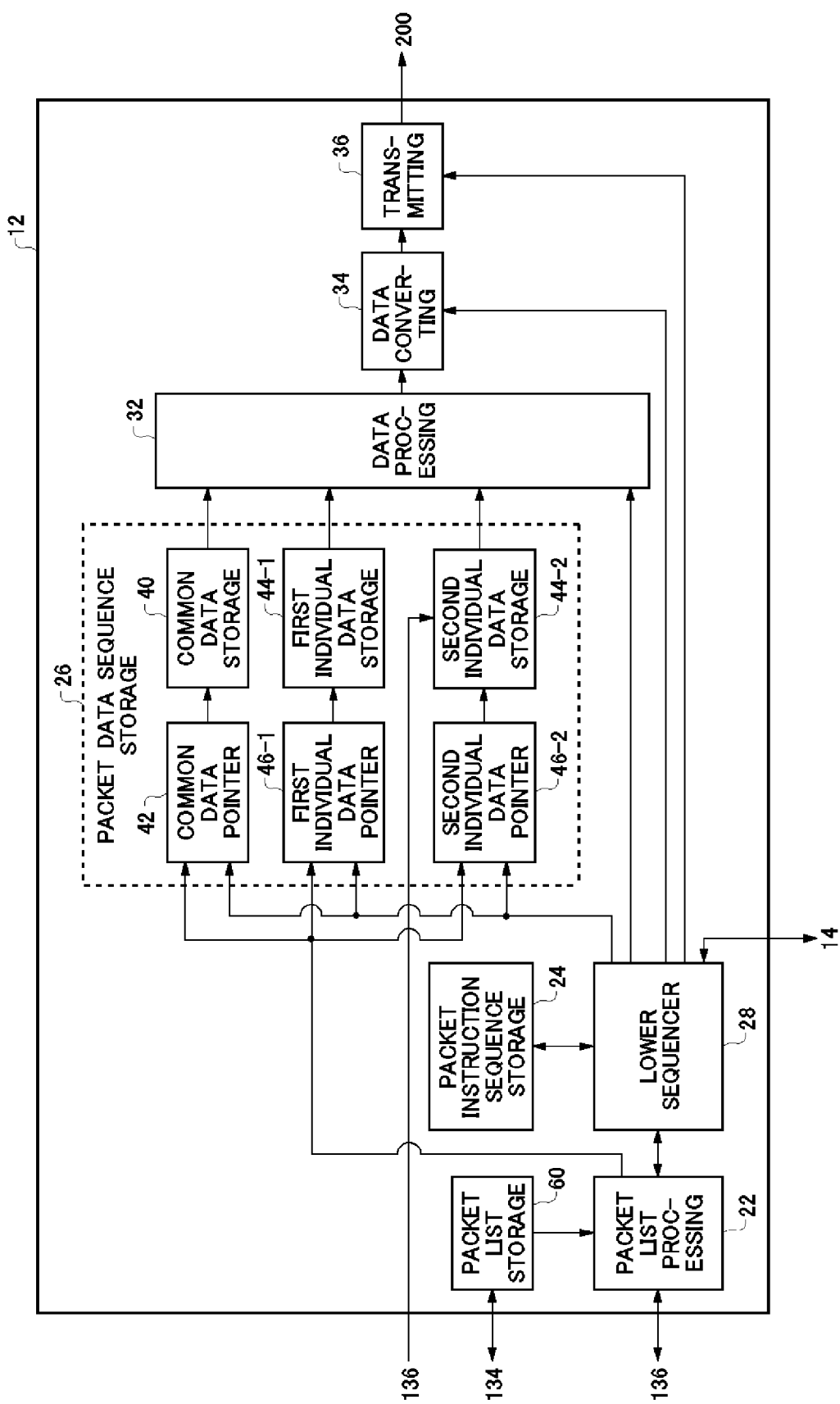
FIG. 7 shows an exemplary configuration of the transmission-side block 12.

FIG. 7 shows an exemplary configuration of the transmission-side block 12. The transmission-side block 12 of the present example transmits data to the device under test 200 in packet units. The transmission-side block 12 includes a packet list processing section 22, a packet instruction sequence storage section 24, a packet data sequence storage section 26, a lower sequencer 28, a data processing section 32, a data converting section 34, a packet list storage section 60, and a transmitting section 36.

The packet list storage section 60 is an example of the pattern list storage section 102, and the packet list processing section 22 is an example of the pattern list processing section 104. In other words, the packet list storage section 60 stores packet lists that include wait instructions and jump instructions. When executing a jump instruction, the packet list processing section 22 executes a packet list at a jump destination designated by the control section 136.

The packet list processing section 22 executes the packet lists stored in the packet list storage section 60 to sequentially designate packets to be exchanged with the device under test 200. For example, the packet list processing section 22 designates an address in the packet instruction sequence storage section 24 at which is stored an instruction sequence for generating the designated packets. Furthermore, the packet list processing section 22 may designate the address of a data sequence, e.g. the leading address of a data sequence, that is included in the packet in the packet data sequence storage section 26, for packets that are to be exchanged with the device under test 200.

In this way, the packet list processing section 22 separately designates an address of the instruction sequence for generating the packet and an address of the data sequence included in the packet. In this case, when the packet list includes an instruction sequence or a data sequence that is common to two or more packets, the packet list processing section 22 may designate the same instruction sequence address or the same data sequence address for the two or more packets.

The packet instruction sequence storage section 24 stores, for each of a plurality of types of packets, an instruction sequence for generating the type of packet. For example, the packet instruction sequence storage section 24 stores an instruction sequence for generating a write packet, an instruction sequence for generating a read packet, an instruction sequence for generating a wait packet, and the like.

The packet data sequence storage section 26 stores, for each of the plurality of types of packets, a data sequence included in the type of packet. For example, the packet data sequence storage section 26 stores a data sequence included in a write packet, a data sequence included in a read packet, a data sequence included in an idle packet, and the like.

The packet data sequence storage section 26 may include a common data storage section 40, a common data pointer 42, a first individual data storage section 44-1, a second individual data storage section 44-2, a first individual data pointer 46-1, and a second individual data pointer 46-2. The common data storage section 40 stores common data that is shared by each type of packet in the data sequence included in the packet. For example, the common data storage section 40 stores, for each type of packet, a start code indicating initiation of the packet, an end code indicating ending of the packet, an instruction code for identifying the type of packet, and the like.

The common data pointer 42 acquires, from the packet list processing section 22, the leading address of a block in which is stored the common data included in the packet designated by the packet list processing section 22. Furthermore, the common data pointer 42 acquires, from the lower sequencer 28, an offset position in the block. The common data pointer 42 supplies the common data storage section 40 with the address designated according to the leading address and the offset position, e.g. the address obtained by adding the offset position to the leading address, and supplies the data processing section 32 with the common data stored at this address.

The first and second individual data storage sections 44-1 and 44-2 each store individual data that changes for each packet in the data sequence included in the each type of packet. For example, the first and second individual data storage sections 44-1 and 44-2 may store actual data transmitted to the device under test 200 or actual data received from the device under test 200, where each type of data is included in each packet.

The first individual data storage section 44-1 stores predetermined individual data that does not change according to the packet list being executed. The second individual data storage section 44-2 stores individual data that changes for each packet list executed. For example, the second individual data storage section 44-2 may receive a transmission of individual data from the control section 136 in the execution processing section 18 prior to testing or during testing.

The first and second individual data pointers 46-1 and 46-2 receive, from the packet list processing section 22, the leading address of the block in which is stored the individual data included in the packet designated by the packet list processing section 22. Furthermore, the first and second individual data pointers 46-1 and 46-2 acquire, from the lower sequencer 28, the offset position in this block.

The first and second individual data pointers 46-1 and 46-2 supply the first and second individual data storage sections 44-1 and 44-2 with the address designated according to the leading address and the offset position, e.g. the address obtained by adding the offset position to the leading address. The first and second individual data pointers 46-1 and 46-2 then supply the data processing section 32 with the individual data stored at the designated address in the first and second individual data storage sections 44-1 and 44-2.

The lower sequencer 28 reads, from the packet instruction sequence storage section 24, the instruction sequence of the packet designated by the packet list processing section 22, i.e. the instruction sequence at the address designated by the packet list processing section 22, and sequentially executes the instructions included in the read instruction sequence. Furthermore, the lower sequencer 28 outputs, from the packet data sequence storage section 26 in an order determined according to the instruction sequence execution, the data sequence of the packet designated by the packet list processing section 22, i.e. the data sequence at the address designated by the packet list processing section 22, thereby generating the test data sequence used for testing the device under test 200.

The lower sequencer 28 may supply the common data pointer 42, the individual data pointer 46-1, and the individual data pointer 46-2 with an offset position representing the position of the data corresponding to the executed instruction in the block in which is stored the data sequence included in the packet designated by the packet list processing section 22. In this case, the lower sequencer 28 may generate an initial value for the initial instruction, and may generate, as the offset position, a count value that is incremented each time the instruction being executed changes.

For each instruction being executed, the lower sequencer 28 supplies the data processing section 32 and the data converting section 34 with control data indicating a designated process, such as a computation or data conversion, to be applied to the read individual data and common data. In this way, the lower sequencer 28 can set a designated data portion in the packet designated by the packet list processing section 22 to be data obtained by applying the designated process to the read data.

Furthermore, for each instruction being executed, the lower sequencer 28 designates which of the common data, the individual data, and the data resulting from the process applied by the data processing section 32 is output by the data processing section 32. Here, the individual data may be the predetermined individual data that does not change according to the executed packet list or the individual data that changes for each executed packet list. In other words, for each instruction execution, the lower sequencer 28 designates, in the data processing section 32, which of (i) the common data storage section 40, (ii) the first individual data storage section 44-1, (iii) the second individual data storage section 44-2, and (iv) a register in the data processing section 32 storing the data to which the designated process was applied, to read the data from, and outputs the read data.

In this way, the lower sequencer 28 can generate the data portion that changes according to the packet in each packet designated by the packet list processing section 22, based on the individual data read from the individual data storage sections 44. Furthermore, the lower sequencer 28 can generate the data portion common to each packet type in each packet designated by the packet list processing section 22, based on the common data read from the common data storage section 40. Yet further, the lower sequencer 28 can apply the designated process to the designated data portion in each packet designated by the packet list processing section 22.

The lower sequencer 28 may supply the packet list processing section 22 with ending notification in response to completion of the execution of the instruction sequence of the packet designated by the packet list processing section 22. In this way, the packet list processing section 22 can sequentially designate packets according to the progression of the instruction execution by the lower sequencer 28.

The lower sequencer 28 may designate, in the transmitting section 36, an edge timing of the signal transmitted to the device under test 200. For example, the lower sequencer 28 may supply the transmitting section 36 with a timing signal to control the edge timing for each packet.

The lower sequencer 28 may communicate with the reception-side lower sequencer 28 in the reception-side block 14. In this way, the transmission-side lower sequencer 28 in the transmission-side block 12 can perform a handshake with the reception-side lower sequencer 28 in the reception-side block 14 to execute the instruction sequences in synchronization.

The transmission-side lower sequencer 28 may notify the reception-side lower sequencer 28 that the test data sequence of a pre-designated packet has been sent to the device under test 200. In this way, the transmission-side lower sequencer 28 may prohibit judging of the acceptability of the received data by the reception-side lower sequencer 28 until the notification is received from the transmission-side lower sequencer 28.

The lower sequencer 28 may receive the notification from the reception-side lower sequencer 28 that a data sequence has been received that matches the generated test data sequence, and may then generate the test data sequence of the pre-designated packet. In this way, after the prescribed packet is received from the device under test 200, the transmission-side lower sequencer 28 can transmit the pre-designated packet to the device under test 200.

The data processing section 32 reads the data sequence of the packet designated by the packet list processing section 22 from the packet data sequence storage section 26, and generates the test data sequence for testing the device under test 200. For example, the data processing section 32 receives data from the common data storage section 40, the first individual data storage section 44-1, and the second individual data storage section 44-2, performs the operation designated by the lower sequencer 28 on the received data, and outputs the result as a piece of data in the test data sequence.

The data converting section 34 performs a data conversion on the test data sequence output by the data processing section 32, at a timing designated by the lower sequencer 28. For example, the data converting section 34 may perform an 8b-10b conversion or the like on the test data sequence using a preset table or the like. Furthermore, the data converting section 34 may scramble the test data sequence. The data converting section 34 outputs the converted data sequence. The transmitting section 36 transmits the test data sequence output by the data converting section 34 to the device under test 200.

Figure 8:
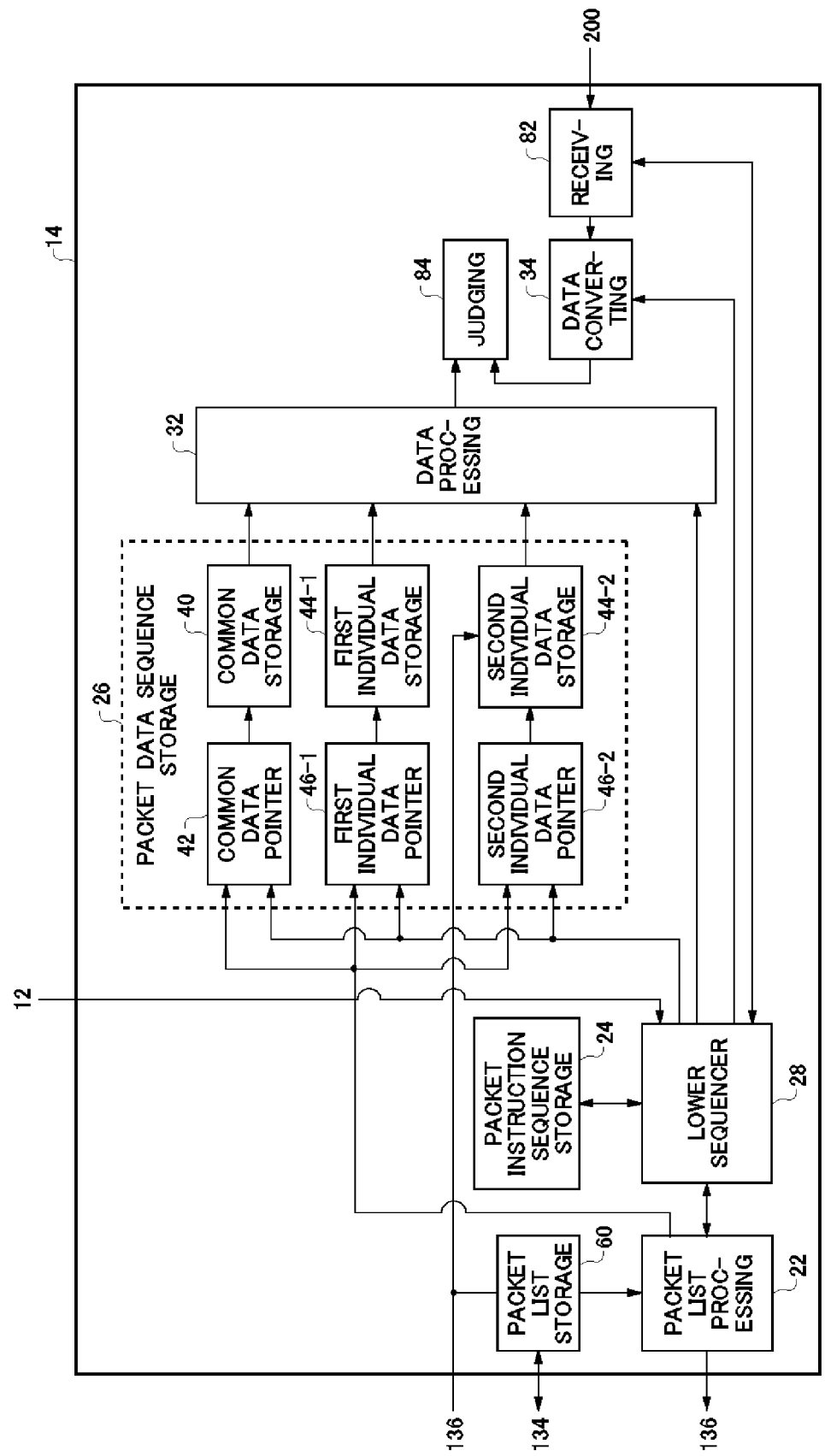
FIG. 8 shows an exemplary configuration of the reception-side block 14.

FIG. 8 shows an exemplary configuration of the reception-side block 14. The reception-side block 14 has substantially the same function and configuration as the transmission-side block 12 shown in FIG. 7. Components of the reception-side block 14 have substantially the same function and configuration as components of the transmission-side block 12 having the same reference numerals, and therefore the following description includes only differing points.

The reception-side block 14 includes the packet list processing section 22, the packet instruction sequence storage section 24, the packet data sequence storage section 26, the lower sequencer 28, the data processing section 32, the data converting section 34, the packet list storage section 60, the receiving section 82, and the judging section 84. The receiving section 82 receives the data sequence of a packet received from the device under test 200.

The data converting section 34 in the reception-side block 14 performs a data conversion on the data sequence received by the receiving section 82, at a timing designated by the lower sequencer 28. For example, the data converting section 34 in the reception-side block 14 performs an 8b-10b conversion or the like on the received data sequence using a preset table or the like. Furthermore, the data converting section 34 in the reception-side block 14 may scramble the received data sequence. The data converting section 34 in the reception-side block 14 outputs the converted data sequence.

The data converting section 34 in the reception-side block 14 supplies the converted data sequence to the judging section 84. The data converting section 34 in the reception-side block 14 may also store the converted data at a designated address in the second individual data storage section 44-2 in the packet data sequence storage section 26.

The packet list processing section 22 in the reception-side block 14 may execute the packet list at the address received from the control section 136. The packet list processing section 22 in the reception-side block 14 then sequentially designates packets that are expected to be received from the device under test 200.

The lower sequencer 28 in the reception-side block 14 causes the packet data sequence storage section 26 to output, as the test data sequence, the data sequence of the packet expected to be output from the device under test 200. The lower sequencer 28 in the reception-side block 14 may designate, in the receiving section 82, a strobe timing for acquiring the data value of the signal output from the device under test 200. The data processing section 32 in the reception-side block 14 supplies the generated test pattern sequence to the judging section 84.

The judging section 84 receives the test data sequence form the data processing section 32, and also receives the data sequence from the data converting section 34. The judging section 84 judges the acceptability of the communication with the device under test 200 based on the result of a comparison between the received data sequence and the test data sequence. For example, the judging section 84 may include a logic comparing section that detects whether the data sequence received by the receiving section 82 matches the test data sequence, and a fail memory that stores the comparison results. Instead, the judging section 84 may notify the lower sequencer 28 when the data sequence received by the receiving section 82 matches the designated data sequence.

The lower sequencer 28 in the reception-side block 14 may communicate with the transmission-side lower sequencer 28 in the transmission-side block 12 shown in FIG. 7. In this way, the reception-side lower sequencer 28 of the reception-side block 14 can perform a handshake with the transmission-side lower sequencer 28 of the transmission-side block 12 to execute the instruction sequences in synchronization.

The reception-side lower sequencer 28 may notify the transmission-side lower sequencer 28 that a data sequence has been received that matches the test data sequence generated by the reception-side lower sequencer 28. In this way, the transmission-side lower sequencer 28 may receive the notification from the reception-side lower sequencer 28 that a data sequence has been received that matches the generated test data sequence, and may then generate the test data sequence of the pre-designated packet.

The reception-side lower sequencer 28 may prohibit the judging section 84 from judging the acceptability of the data sequence received by the receiving section 82 until notification is received from the transmission-side lower sequencer 28 that the test data sequence of the pre-designated packet has been sent to the device under test 200. In this way, after the prescribed packet has been sent to the device under test 200, the reception-side lower sequencer 28 can judge whether the response signal corresponding to the prescribed packet has been output by the device under test 200.

Figure 9:
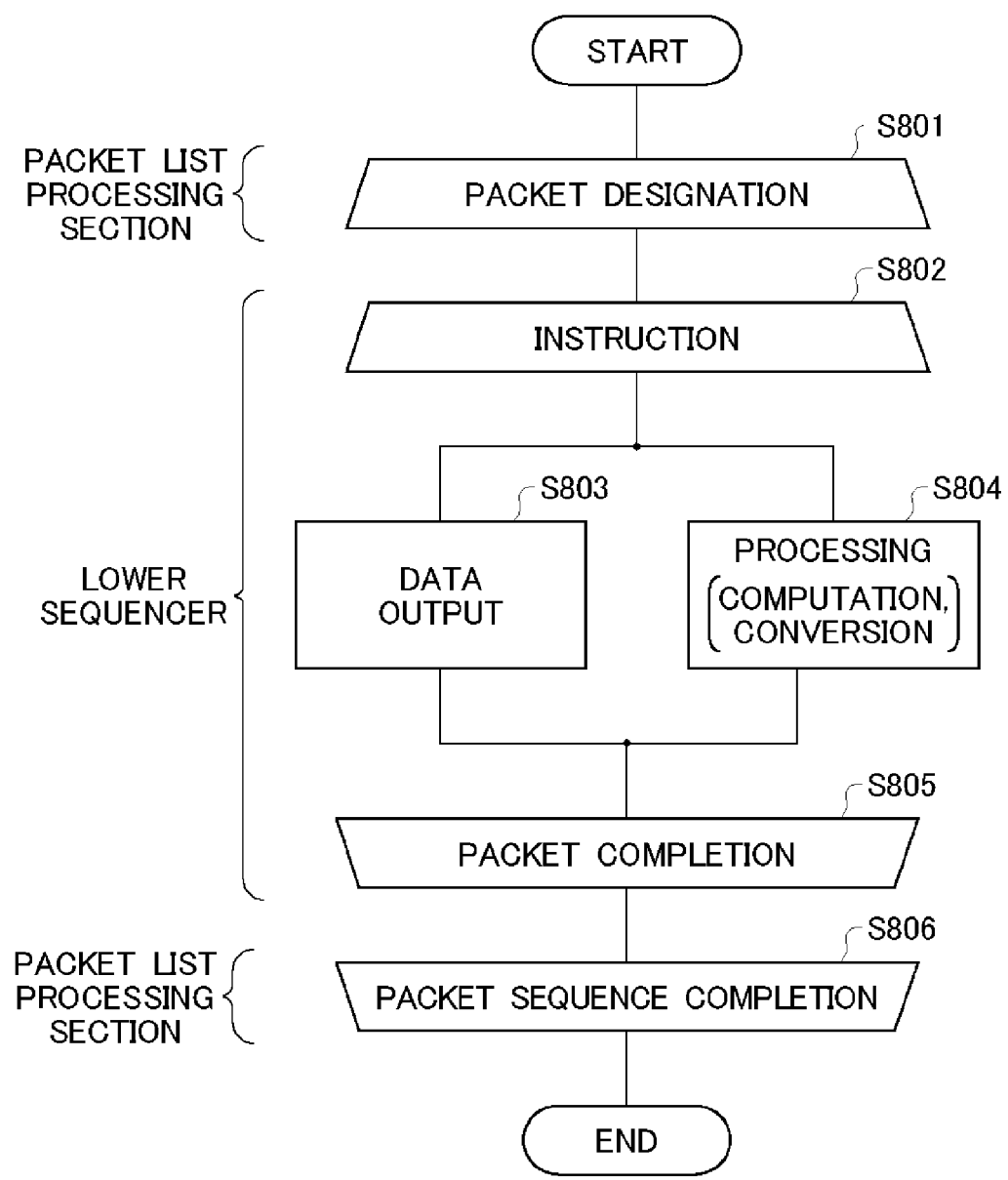
FIG. 9 shows a process flow of the test apparatus 20 according to the present embodiment.

FIG. 9 shows a process flow of the test apparatus 20 according to the present embodiment. First, the packet list processing section 22 executes a packet list to sequentially designate the packets for communication with the device under test 200 (S801, S806).

Upon receiving designation of a packet from the packet list processing section 22, the lower sequencers 28 repeatedly execute the processes from S802 to S805. Upon receiving the packet designation, the lower sequencers 28 acquire the instruction for generating this packet from the packet instruction sequence storage section 24, and begin sequential execution from the leading instruction. The lower sequencers 28 perform the processes of step S803 and S804 for each instruction execution (S802, S805).

At step S803, the lower sequencers 28 output the data corresponding to the current instruction. At step S804, the lower sequencers 28 execute the computation or data conversion corresponding to the current instruction. The lower sequencers 28 perform steps S803 and S804 in parallel.

After the lower sequencers 28 execute the final instruction, the process flow returns to the packet list processing section 22, which sends the next packet designation to the lower sequencers 28 (S805). Upon completing processing of the final instruction in the packet list sequence including a plurality of packet lists, the packet list processing section 22 ends the process flow (S806).

The packet list executed last from among the plurality of packet lists need not include a wait instruction and a jump instruction. When maintaining the state of the device under test 200 between packet sequences, the packet list to be executed last may include a wait instruction and a jump instruction at the end thereof.

The test apparatus 20 described in FIGS. 7 to 9 uses separate sequencers to execute the packet list representing the packet sequence and the instruction sequences within the packets. In this way, the test apparatus 20 can use very simple programming. Furthermore, the test apparatus 20 can share data and instruction sequences for generating common packet types, and can therefore decrease the amount of information stored.

The test apparatus 20 individually sets, in the packet list processing section 22, the address of the data sequence read by the lower sequencer 28 and the address of the instruction sequence executed by the lower sequencer 28. In this way, the test apparatus 20 can generate different data sequences from the same instruction sequence. Accordingly, the test apparatus 20 need not store a plurality of identical instruction sequences, thereby decreasing the amount of information stored.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, the test apparatus 20 may test a plurality of devices under test 200 in parallel. In this case, the test apparatus 20 may provide the communication processing section 16 in parallel to the plurality of devices under test 200. Furthermore, each pattern list processing section 104 may end the wait instruction when the test results of all of the devices under test 200 are a prescribed result.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a pattern list storage section that stores a plurality of pattern lists that each designate, in a prescribed order, the test patterns to be output by the device under test; and
    a pattern list processing section that (i) sequentially outputs the test patterns by sequentially executing the pattern lists according to test results of the device under test and, (ii) when transitioning from a current pattern list to a subsequent pattern list, repeatedly outputs a prescribed idle pattern until execution of the subsequent pattern list is begun, wherein
    each pattern list includes:
        a wait instruction for repeatedly outputting a prescribed idle pattern until a prescribed condition is fulfilled; and
        a jump instruction for designating the subsequent pattern list to be executed after the current pattern list, after the wait instruction has ended, and
    the test apparatus further includes a control section that designates a jump destination indicated by the jump instruction included in each pattern list, after execution of the pattern list has begun.

2. The test apparatus according to claim 1, wherein
the pattern list storage section stores the pattern lists that each have the wait instruction and the jump instruction at the end thereof.

3. The test apparatus according to claim 2, wherein
when the test result of the device under test fulfills the prescribed condition, the pattern list processing section ends execution of the wait instruction and executes the jump instruction, and
the control section designates, as the jump destination of the jump instruction, a pattern list that corresponds to the test result of the device under test.

4. The test apparatus according to claim 3, wherein
the control section designates the jump destination of a jump instruction while the pattern list processing section is repeatedly executing the corresponding wait instruction.

5. The test apparatus according to claim 4, further comprising
a register that stores addresses of jump destinations of jump instructions, wherein the control section writes the addresses in the register.

6. The test apparatus according to claim 2, wherein
the pattern list storage section stores pattern lists in which an instruction code including a wait instruction and a jump instruction is associated with operands that designate test patterns, the pattern lists designating an order of output of the test patterns by executing the instruction code, and
the pattern list processing section sequentially outputs the test patterns by performing, in advance, a look-ahead process for (i) the instruction code to be performed prior to the instruction code being currently performed and (ii) the corresponding test pattern, and stopping the look-ahead process when the wait instruction is detected by the look-ahead process.

7. The test apparatus according to claim 6, wherein
after the jump instruction is executed, the pattern list processing section resumes the look-ahead process.

8. The test apparatus according to claim 2, wherein
the pattern list processing section repeatedly outputs a prescribed number of the test patterns output immediately before the wait instruction, as the idle pattern.

9. The test apparatus according to claim 8, wherein
the wait instruction changes the prescribed number of test patterns according to a designated value.

10. A method for testing a device under test, comprising:
storing a plurality of pattern lists that each designate, in a prescribed order, the test patterns to be output by the device under test; and
(i) sequentially outputting the test patterns by sequentially executing the pattern lists according to test results of the device under test and, (ii) when transitioning from a current pattern list to a subsequent pattern list, repeatedly outputting a prescribed idle pattern until execution of the subsequent pattern list is begun, wherein
each pattern list includes:

a wait instruction for repeatedly outputting a prescribed idle pattern until a prescribed condition is fulfilled; and a jump instruction for designating the subsequent pattern list to be executed after the current pattern list, after the wait instruction has ended, and the method further comprises designating a jump destination indicated by the jump instruction included in each pattern list, after execution of the pattern list has begun.

* * * * *